(12) United States Patent
Klunder et al.

(10) Patent No.: US 7,332,731 B2
(45) Date of Patent: Feb. 19, 2008

(54) RADIATION SYSTEM AND LITHOGRAPHIC APPARATUS

(75) Inventors: Derk Jan Wilfred Klunder, Geldrop (NL); Maarten Marinus Johannes Wilhelmus Van Herpen, Heesch (NL)

(73) Assignee: Asml Netherlands, B.V., Veldhoven (NL)

( * ) Notice: Subject to any disclaimer, the term of this patent is extended or adjusted under 35 U.S.C. 154(b) by 233 days.

(21) Appl. No.: 11/294,347

(22) Filed: Dec. 6, 2005

(65) Prior Publication Data

US 2007/0125968 A1 Jun. 7, 2007

(51) Int. Cl.
*A61N 5/06* (2006.01)

(52) U.S. Cl. .............................. 250/504 R; 250/492.2; 250/492.1; 250/492.22; 378/34; 378/119; 378/143; 355/30; 355/53; 356/237.2; 156/345.48; 156/345.5

(58) Field of Classification Search ............. 250/492.2, 250/504 R, 492.1, 492.22; 378/34, 119, 378/143; 355/30, 53; 356/237.2; 156/345.48, 156/345.5
See application file for complete search history.

(56) References Cited

U.S. PATENT DOCUMENTS

| | | | | |
|---|---|---|---|---|
| 4,408,338 | A | 10/1983 | Grobman | 378/34 |
| 4,837,794 | A | 6/1989 | Riordan et al. | 378/119 |
| 6,359,969 | B1 | 3/2002 | Shmaenok | 378/156 |
| 6,459,472 | B1 | 10/2002 | De Jager et al. | 355/68 |
| 6,838,684 | B2 | 1/2005 | Bakker et al. | 250/492.2 |
| 7,034,308 | B2 | 4/2006 | Bakker et al. | 250/370.08 |
| 7,057,190 | B2 | 6/2006 | Bakker et al. | 250/492.2 |
| 7,106,832 | B2 | 9/2006 | Klunder et al. | 378/156 |
| 7,145,132 | B2 | 12/2006 | Bakker et al. | 250/251 |
| 7,230,258 | B2 * | 6/2007 | Ruzic et al. | 250/504 R |
| 7,233,010 | B2 * | 6/2007 | Van Herpen et al. | 250/492.2 |
| 7,262,423 | B2 * | 8/2007 | Van Herpen et al. | 250/492.2 |
| 2004/0184014 | A1 | 9/2004 | Bakker et al. | 355/30 |
| 2006/0012761 | A1 | 1/2006 | Bakker et al. | 355/30 |
| 2006/0138348 | A1 | 6/2006 | Bakker | 250/492.1 |
| 2006/0138362 | A1 | 6/2006 | Bakker et al. | 250/504 |
| 2006/0139604 | A1 | 6/2006 | Wassink et al. | 355/67 |
| 2006/0151717 | A1 | 7/2006 | Klunder et al. | 250/492.2 |
| 2006/0169929 | A1* | 8/2006 | Wassink | 250/504 R |
| 2006/0186353 | A1 | 8/2006 | Wassink | 250/492.2 |
| 2006/0219958 | A1 | 10/2006 | Wassink | 250/504 |

(Continued)

FOREIGN PATENT DOCUMENTS

EP 1 274 287 A1 1/2003

(Continued)

OTHER PUBLICATIONS

Arnoud Cornelis Wassink, U.S. Appl. No. 11/433,761, May 15, 2006.
Derk Jan Wilfred Klunder, U.S. Appl. No. 11/319,190, Dec. 28, 2005.

(Continued)

*Primary Examiner*—Jack I. Berman
*Assistant Examiner*—Meenakshi S Sahu
(74) *Attorney, Agent, or Firm*—Pillsbury Winthrop Shaw Pittman LLP (57) ABSTRACT

A radiation system for providing a projection beam of radiation is disclosed. The radiation system includes an extreme ultraviolet source for providing extreme ultra violet radiation, and a contamination barrier that includes a plurality of closely packed foil plates for trapping contaminant material coming from the radiation source. The contamination barrier encloses the extreme ultraviolet radiation source.

20 Claims, 5 Drawing Sheets

U.S. PATENT DOCUMENTS

| | | |
|---|---|---|
| 2006/0243927 A1 | 11/2006 | Tran et al. .................. 250/504 |
| 2006/0261290 A1* | 11/2006 | Wilhelmus Van Herpen et al. ........................ 250/492.2 |
| 2007/0018118 A1 | 1/2007 | Sjmaenok et al. ....... 250/492.2 |
| 2007/0023706 A1 | 2/2007 | Sjmaenok et al. .......... 250/504 |
| 2007/0115443 A1* | 5/2007 | Box et al. ..................... 355/30 |

FOREIGN PATENT DOCUMENTS

| | | |
|---|---|---|
| EP | 1 491 963 A2 | 12/2004 |
| EP | 1 491 963 A3 | 8/2005 |
| JP | 9-320792 | 12/1997 |
| JP | 2000-98098 | 4/2000 |
| JP | 2001-57298 | 2/2001 |
| WO | WO 99/42904 | 8/1999 |
| WO | WO 01/37309 A1 | 5/2001 |

OTHER PUBLICATIONS

Levinus Pieter Bakker, U.S. Appl. No. 11/493,848, Jul. 27, 2006.
Leonid Aizikovitch Sjmaenok, U.S. Appl. No. 11/481,252, Jul. 6, 2006.
Lambertus Adrianus Van Den Wildenberg, U.S. Appl. No. 11/392,951, Mar. 30, 2006.
Arnoud Cornelis Wassink, U.S. Appl. No. 11/391,691, Mar. 29, 2006.
Leonid Aizikovitch Sjmaenok, U.S. Appl. No. 11/175,036, Jul. 6, 2005.
Maarten Marinus Johannes wilhelmus Van Herpen, U.S. Appl. No. 11/133,460, May 20, 2005.
International Search Report issued for PCT Application No. PCT/NL2006/000616, dated Apr. 24, 2007.

* cited by examiner

RADIATION SYSTEM AND LITHOGRAPHIC APPARATUS

FIELD

The present invention relates to a radiation system and a lithographic apparatus. Specifically, the invention relates to a radiation system for providing a projection beam of radiation. The radiation system includes an extreme ultraviolet radiation source for providing extreme ultraviolet radiation, and a contamination barrier that includes a plurality of closely packed foil plates for trapping contaminant material coming from the radiation source.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to extreme ultraviolet radiation (EUV) radiation, radiation sources used in EUV lithography generate contaminant material that is harmful for the optics and the working environment wherein the lithographic process is carried out. Such is especially the case for EUV sources operating via a laser induced plasma or discharge plasma. Hence, in EUV lithography, a desire exists to limit the contamination of the optical system that is arranged to condition the beams of radiation coming from an EUV source. To this end, it is known to use a so called foil trap, for instance, as disclosed in EP1491963. A foil trap uses a high number of closely packed foils aligned generally parallel to the direction of the light generated by the EUV source. Contaminant debris, such as micro-particles, nano-particles and ions can be trapped in walls provided by foil plates. Thus, the foil trap functions as a contamination barrier trapping contaminant material from the source. The known rotating foil traps are oriented with a rotation axis oriented along an optical axis of the system. This results in a relatively high heat load since the foil plates are illuminated during the complete rotation of the foil trap. In addition, this configuration, that is aligned along an optical axis requires a relatively high volume in front of the source which poses problems for relaying the EUV radiation to downstream optics.

SUMMARY

It is desirable to further limit the effective volume of the contamination barrier in front of the source and to limit the heat load thereto. It is further desirable to provide a radiation system that is optimally free of contamination while keeping an optimized radiation yield.

According to an embodiment, there is provided a radiation system for providing a projection beam of radiation. The radiation system includes an extreme ultraviolet radiation source for providing extreme ultraviolet radiation, and a contamination barrier that includes a plurality of closely packed foil plates for trapping contaminant material coming from the radiation source. The contamination barrier encloses the extreme ultraviolet radiation source.

Specifically, according to the invention, the contamination barrier encloses the extreme ultraviolet radiation source. The enclosed extreme ultraviolet radiation source is thus positioned within the contamination barrier so that the contamination barrier wholly surrounds the source.

According to an embodiment, there is provided a lithographic apparatus that includes a radiation system for providing a beam of radiation. The radiation system includes an extreme ultraviolet radiation source for providing extreme ultraviolet radiation, and a contamination barrier that includes a plurality of closely packed foil plates for trapping contaminant material coming from the radiation source. The contamination barrier encloses the extreme ultraviolet radiation source. The apparatus also includes a patterning device for patterning the beam of radiation, and a projection system for projecting the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
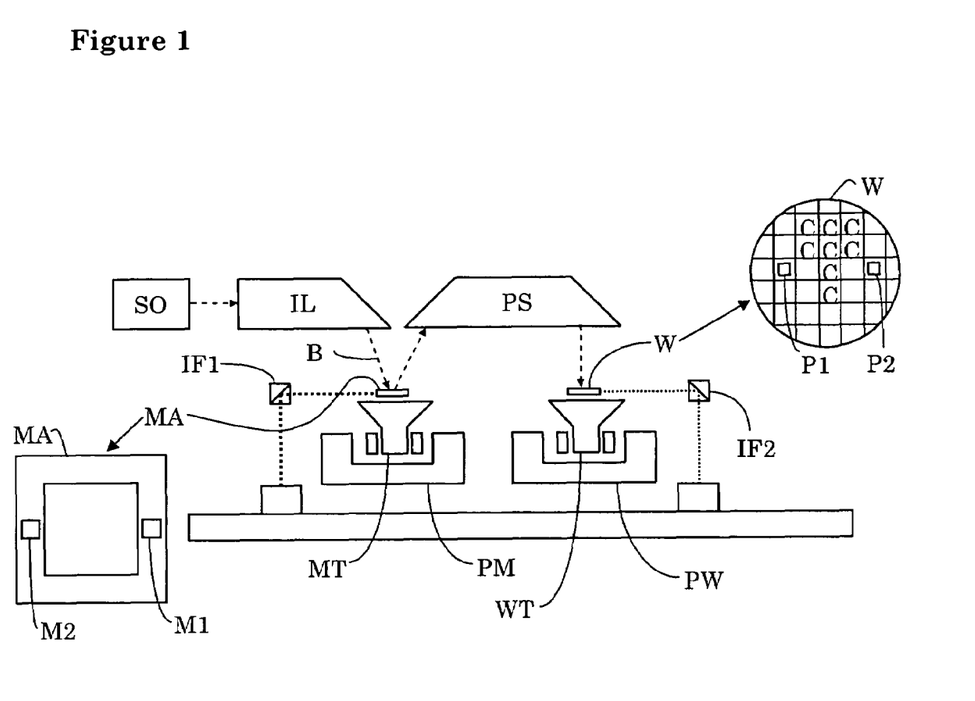
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
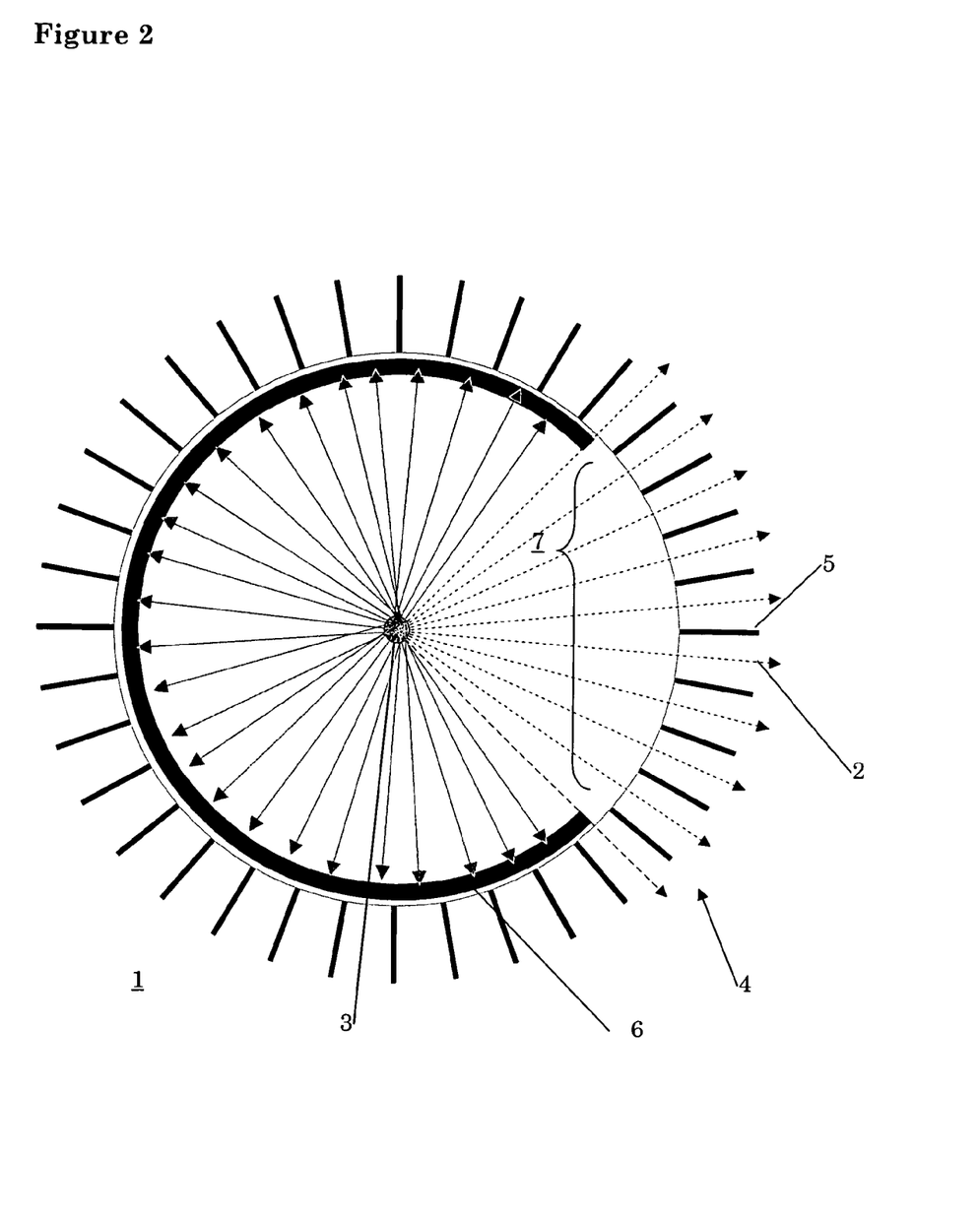
FIG. 2 depicts a top view of a first embodiment of the invention.
Figure 3:
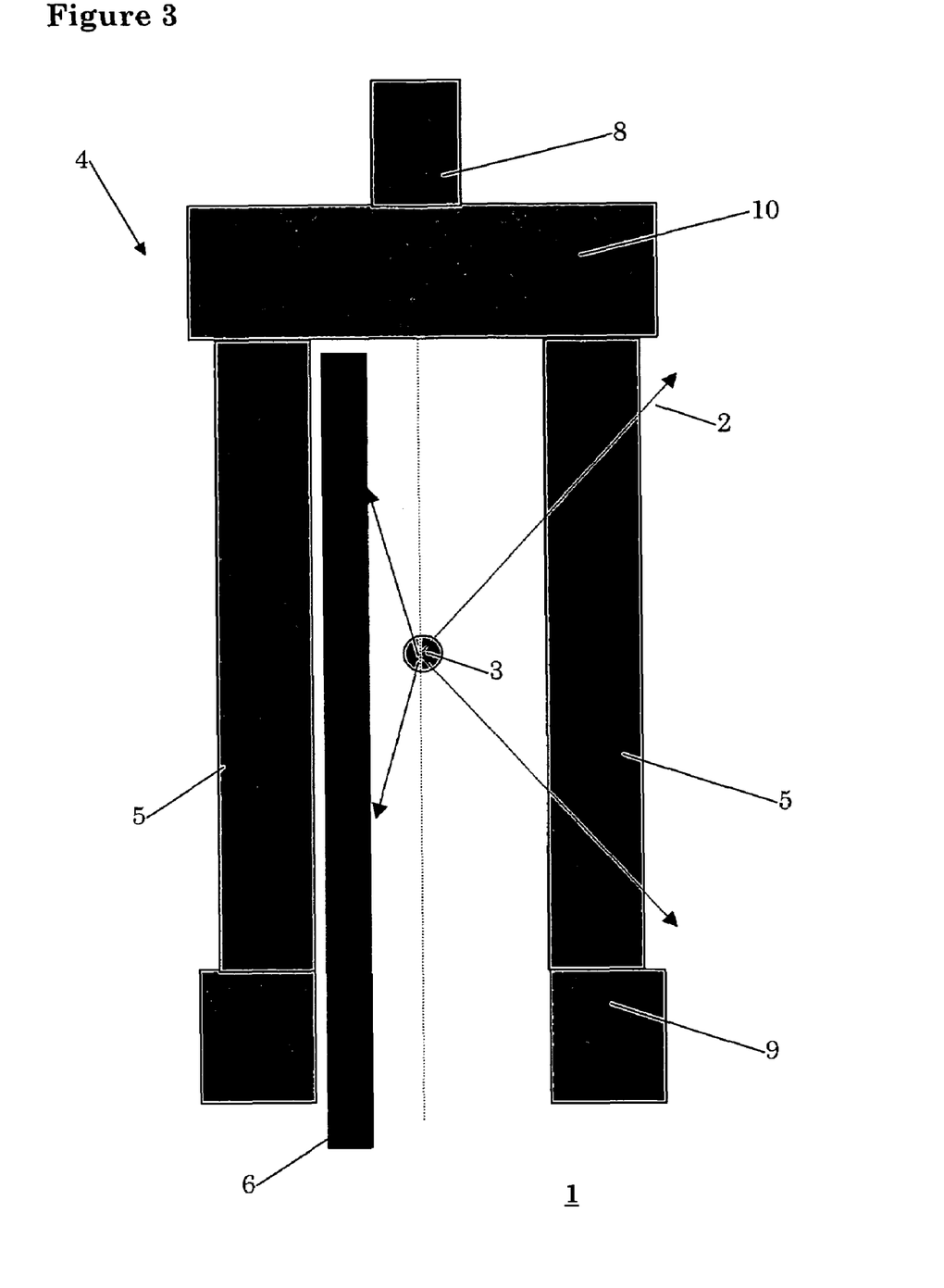
FIG. 3 depicts a cross sectional side view of the embodiment shown in FIG. 2.

FIG. 2 shows a basic configuration for a radiation system 1 according to the invention. In FIG. 2, the dashed lines represent EUV radiation 2 coming from an EUV source 3, typically a laser induced plasma source or a plasma discharge source such as a tin, lithium or xenon source, however, other sources are possible. A foil trap functions as a contamination barrier 4 for trapping contaminant material coming from the radiation source 3. To this end, the contamination barrier 4 is provided with a plurality of closely packed foil plates 5, typically arranged at a distance of 0.3-5 mm (normally about 1 mm), whereas the foil plates 5 are shaped having a generally rectangular form and are mounted according to a cylinder shape as can be seen in FIG. 3. The contamination barrier 4 is rotatable relative to the source 3 and encloses the source 3. In the depicted embodiment the contamination barrier is rotatable, however, non-rotatable variants are feasible comprising appropriate means such as buffer gas or electromagnetic fields for trapping the debris within the foils. Also, the source 3 may be rotatable. Furthermore, advantageously, the source 3 is positioned in an intersection of extended planes through said plurality of foil plates 5 which defines an optical center of the contamination barrier, which in the depicted embodiment in FIG. 2 coincides with the central axis of said contamination barrier 4. In this center, for an ideal point like EUV source, radiation passes the foils generally parallel and shielding of the radiation is minimal and only takes place over a thickness of the foil plate which is accordingly kept minimal without compromising mechanical integrity. A typical value can be about 100 micron which may result in a shielding of about 10%.

Furthermore, FIG. 2 shows that the contamination barrier 4 according to an embodiment of the invention advantageously comprises a shield 6 that shields said contamination barrier 4 from said EUV source 3, and partially encloses said EUV source 3. In FIG. 2, the shield 6 is cylindrical in shape and partially encloses the source 3. By a shield 6 defining an aperture 7 of 45° the estimated thermal radiation heat load on the contamination barrier 4 can be reduced with 30%, which may amount to a considerable drop in temperature of the contamination barrier 4. Generally, the size of the aperture 7 will be chosen as a trade off between optimizing light output and minimizing heat load, where typical values will vary between 30° and 60°. Furthermore, the shield 6 is depicted as absorbent to EUV radiation, which, as will be elucidated in FIG. 4, results in a considerable heat load of the shield 6. However, other forms are possible including reflective shields, which may be shaped to optimize a radiation yield of the radiation system 1.

FIG. 3 illustrates a side view of the radiation system 1 shown in FIG. 2. Here, a general cylindrical shape of the contamination barrier 4 is illustrated, rotatably mounted with an axis of rotation 8 along a cylinder axis. which has good manufacturability. The foil plates 5 are positioned between opposing mounts 9, 10. In the embodiment shown, the lower mount 9 is annular in shape, which allows the bottom side of the system to be open. Accordingly, the source 3 can be installed and operated easily from below by providing electrodes (not shown) to the source through the annular mount 9. The upper mount 10 is disk shaped and attached to a rotation axis 8 operated through appropriate drive means (not shown). On the mounts 9, 10 (not shown) radial slits may be provided to attach the foils 5. The dimensions of the foils 5 are typically 20×200 mm, and the disc has a diameter of about 200-300 mm, however other dimensions are off course possible when necessary. Preferably, the height of the foil plates 5 is chosen to optimize the light yield towards collector optics (not shown) positioned in front of the radiation system for converging EUV radiation from said radiation system 1 to further downstream EUV optics, in particular to projection optics of a lithographic apparatus as shown in FIG. 1. Such a collector element may comprise shell formed grazing incidence reflective surfaces. Alternatively it may be of a multilayer normal incidence type.

In the embodiment shown, a small asymmetry is introduced by the cylinder shape of the contamination barrier 4. This means that the blocking path for debris and for EUV light can vary with an elevation angle. A more spherical symmetrical shape may be provided by a contamination barrier 4 wherein the foils 5 are shaped having an arc form and are mounted according to a spherical shape. However, the cylinder shape is preferable for manufacturability reasons. In this respect, a mechanical connection can be provided between the opposing mounts 9, 10, in excess to the foils 5 connected therebetween, to provide a stable unitary rotary movement of the contamination barrier 4. Such a connection may be in the form of spokes (not illustrated), which may cause a small loss to the EUV radiation yield. In the shown embodiment, the annular mount 9 is freely suspended. However, it can also be mounted on a separate rotation axis to increase mechanical stability.

Figure 4:
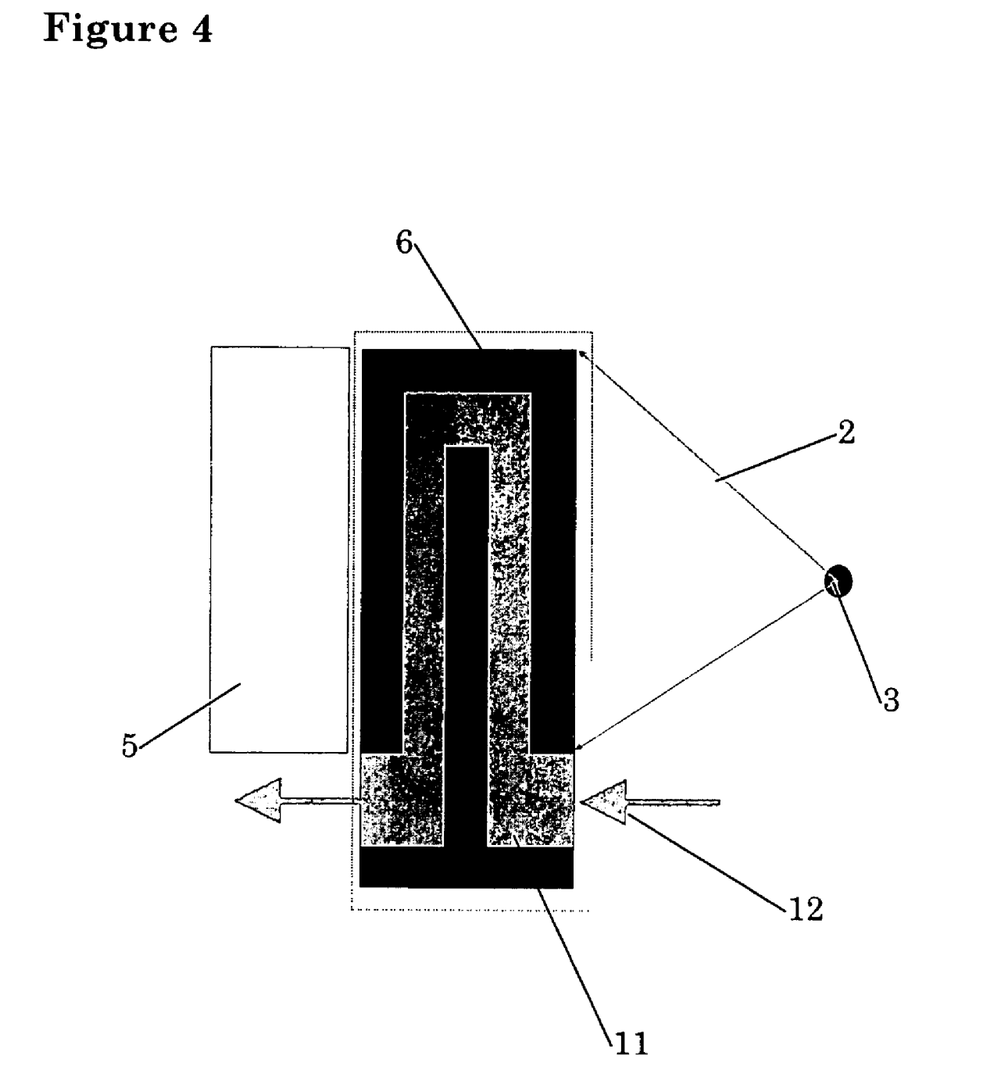
FIG. 4 depicts a cross sectional side view of an alternative embodiment implementing active cooling of a shield.

FIG. 4 schematically shows a cross sectional side view of a preferential design of the shield 6. In the embodiments depicted in FIG. 2 and FIG. 3, a substantial part of the radiation from source 3 is incident on the shield 6 which accordingly absorbs a considerable fraction of radiated energy of source 3. A typical value of a spatial angle may be about 2 pi. This may lead to high temperatures of the shield 6, which may cause thermal re-radiation of the absorbed EUV power.

In order to suppress these effects, it is desirable to lower the temperature of the shield 6. Accordingly, in one aspect, the invention proposes to provide the shield 6 with a cooling duct 11 filled with an appropriate coolant 12, as shown in FIG. 4. The coolant 12, in particular, water (heat capacity of about 4200 J/kg·K), has a heat capacity which is considerably higher than the material of the shield, which can be for instance molybdenum (heat capacity of about 250 J/kg·K), which can transport the heat away out of the shield. For a source radiating 18 kW, a power of about 9.55 kW may be absorbed by the shield. As an example, for such a scheme, a volume flow of about 13.6 liter/min water could provide cooling while allowing the water to heat up from about 10° C. to about 20° C. In the illustrated embodiment, the cooling duct 11 is formed by a double wall structure comprised in the shield 6.

Figure 5:
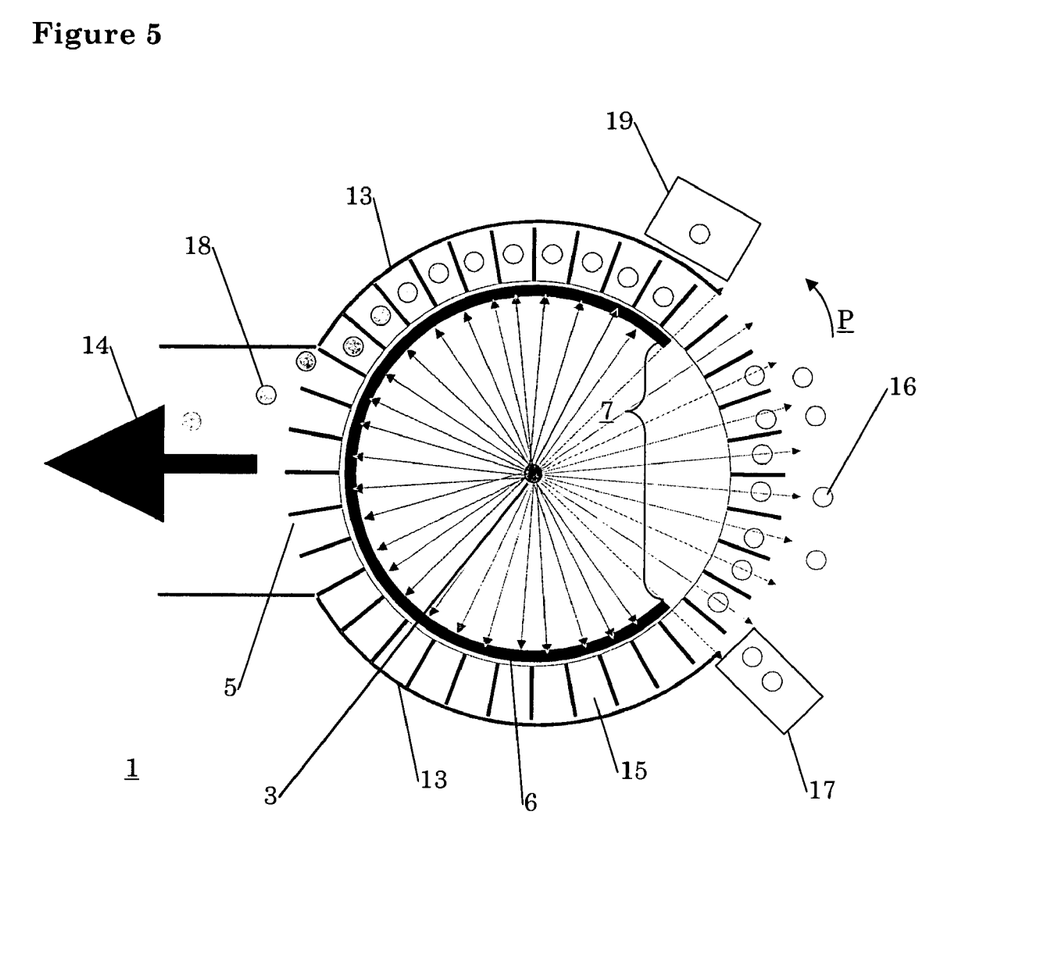
FIG. 5 depicts an alternative embodiment implementing pumping using the foils of the foil trap as pump blades.

FIG. 5 shows a further advantageous embodiment of the invention in cross sectional lateral view. In this embodiment, an enclosure 13 is provided enclosing partially the contamination barrier 4 opposite the shield 6. Through rotation of the foils 5, the foils 5 function as pump blades moving between the shield 6 and the enclosure 13. By connecting the enclosure 13 to a pump 14, accordingly, particles can be pumped out of the volumes 15 formed between the foils 5. In this way, an enhanced drain of particles can be provided thus improving the pressure environment in the radiation system 1 and further downstream optics (not shown). In particular, this embodiment allows for pumping close to the source 3, thus improving the operating pressure for the source, which benefits from a generally low vacuum pressure. By way of example, for the dimensioning of the foils 5 as hereabove described with reference to FIG. 3, for a rotation frequency of 50 Hz of the contamination barrier 4, a pumping volume may be provided of about 138 l/s. For a desired gas pressure at the source of 0.5 Pa, the amount of gas pumped per unit time is about 41.4 scc/m, which is the amount of gas to be pumped away by the pump 14.

Typical applications of the pumping embodiment illustrated in FIG. 5 are for providing a buffer gas 16 in the vicinity of the aperture 7. Accordingly, a buffer gas outlet 17 is provided in close vicinity of the aperture 7, in particular, on the upstream side of the aperture 7 defined by the rotary movement of the foils 5 illustrated by arrow P. The outlet preferably fills the volume 15 between the foils 5. The buffer gas has a pressure that is high enough to impart some inhibition to escaping particles, in particular, ion like particles or gas particles, however, too high pressures are disadvantageous for the operating source. Typical pressures may be about 0.5 Pa for the buffer gas 16.

Also, a purge gas 18 may be provided in said enclosure 13 for purging the foils 5. For providing the purge gas 18, a purge gas injector 19 may be provided behind the shield 6 on the downstream side of the aperture 7, defined by the rotary movement of the foils 5 illustrated by arrow P. A typical purge gas 18 may comprise hydrogen radicals, or deuterium radicals, for instance at a pressure of about 10 mbar. By this arrangement, the foils can be cleaned by the purge gas 18 when shielded from the source 3, at a cleaning rate of about 200 nm/hour. Other purge gases suitable for cleaning the foils comprise halogen gases. Although this purge gas application has been illustrated for the contamination barrier 4 of FIG. 5 enclosing the source 3, according to the current invention, this concept may also be applicable for a radiation system for providing a projection beam of radiation comprising: an extreme ultraviolet radiation source for providing extreme ultraviolet radiation; a contamination barrier comprising a plurality of closely packed foil plates for trapping contaminant material coming from said radiation source; wherein a shield is provided for partially shielding said contamination barrier from said extreme ultraviolet radiation source; and wherein a purge gas injector is provided behind the shield for cleaning said contamination barrier when not exposed to said extreme ultraviolet radiation source. Accordingly, the hydrogen radicals, which, for example, may be generated by a hot-filament by methods known to the skilled person, may be inserted into the volume 15 between the foils when these are shielded from the source 3. Subsequently, the purge gas 18 and reaction products (for a tin source this can be typically tin hydride gas) are pumped away by a pump 14 before the foils are exposed to the EUV source 3.

For a source 3 operating at a frequency of 6 kHz and depositing $10^{15}$ atoms/pulse in 4 pi an estimated tin deposition is about 91 nm/hour, which appears to be below an estimated cleaning rate maximum of 200 nm/hour. Accordingly, on line cleaning of the contamination barrier 4 while being in use can be provided, or at least, a considerable prevention of growth of contamination layers on the contamination barrier.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation system for providing a projection beam of radiation comprising:
   an extreme ultraviolet radiation source for providing extreme ultraviolet radiation; and
   a contamination barrier comprising a plurality of closely packed foil plates for trapping contaminant material coming from said radiation source, said contamination barrier enclosing said extreme ultraviolet radiation source.

2. A radiation system according to claim 1, wherein said contamination barrier is rotatable relative to said source.

3. A radiation system according to claim 2, further comprising a shield for shielding said EUV source from said contamination barrier, said shield partially enclosing said EUV source.

4. A radiation system according to claim 3, wherein said shield is provided with a cooling duct comprised in said shield.

5. A radiation system according to claim 3, further comprising a purge gas outlet for providing a purge gas in a volume defined by said foil plates, the purge gas outlet being shielded from the source by the shield.

6. A radiation system according to claim 5, wherein said purge gas is selected from the group consisting of hydrogen radicals, deuterium radicals and halogen gases.

7. A radiation system according to claim 2, further comprising an enclosure partially enclosing said contamination barrier and comprising a connector for connecting to a pump, said barrier being rotatable in said enclosure.

8. A radiation system according to claim 1, wherein the source is positioned in an intersection of extended planes through said plurality of foil plates.

9. A radiation system according to claim 1, wherein the source is positioned on a central axis of said contamination barrier.

10. A radiation system according to claim 1, wherein the foil plates are shaped having a generally rectangular form and are mounted according to a cylinder shape.

11. A radiation system according to claim 1, wherein the foil plates are shaped having an arc form and are mounted according to a spherical shape.

12. A radiation system according to claim 1, wherein said foil plates are positioned between opposing mounts, at least one of said mounts being annular in shape.

13. A radiation system according to claim 1, further comprising a buffer gas outlet for providing a buffer gas between said foil plates.

14. A radiation system according to claim 1, wherein said EUV source is a laser induced plasma source or a discharge produced plasma source.

15. A radiation system according to claim 1, wherein said EUV source comprises tin, lithium or xenon.

16. A lithographic apparatus comprising:
   a radiation system for providing a beam of radiation, said radiation system comprising an extreme ultraviolet radiation source for providing extreme ultraviolet radiation, and a contamination barrier comprising a plurality of closely packed foil plates for trapping contaminant material coming from said radiation source, said contamination barrier enclosing said extreme ultraviolet radiation source;
   a patterning device for patterning the beam of radiation; and
   a projection system for projecting the patterned beam of radiation onto a substrate.

17. A lithographic apparatus according to claim 16, wherein said contamination barrier is rotatable relative to said source.

18. A lithographic apparatus according to claim 17, wherein said radiation system further comprises a shield for shielding said EUV source from said contamination barrier, said shield partially enclosing said EUV source.

19. A lithographic apparatus according to claim 18, wherein said shield is provided with a cooling duct comprised in said shield.

20. A lithographic apparatus according to claim 18, wherein said radiation system further comprises a purge gas outlet for providing a purge gas in a volume defined by said foil plates, the purge gas outlet being shielded from the source by the shield.

* * * * *